United States Patent [19]

Rapaich et al.

[11] Patent Number: 6,140,577
[45] Date of Patent: Oct. 31, 2000

[54] ELECTRONIC CHASSIS ELECTRO-MAGNETIC INTERFERENCE SEAL AND SEALING DEVICE

[75] Inventors: Mark Rapaich, Wertfield, Iowa; Elisa E. Zappacosta, North Souix City, S. Dak.

[73] Assignee: Gateway 2000, INC, North Sioux City, S. Dak.

[21] Appl. No.: 09/168,912

[22] Filed: Oct. 8, 1998

[51] Int. Cl.[7] ................................................. H05K 9/00
[52] U.S. Cl. ...................... 174/35 R; 361/800; 361/816; 361/683
[58] Field of Search .............................. 174/35 R, 35 GC, 174/35 MS; 361/816, 818, 800, 753, 683

[56] References Cited

U.S. PATENT DOCUMENTS

| | | | |
|---|---|---|---|
| 2,520,725 | 8/1950 | Judd | 248/361 |
| 2,531,911 | 11/1950 | Johnson | 174/35 TS |
| 2,800,698 | 7/1957 | Wood | 24/81 |
| 2,844,644 | 7/1958 | Soule et al. | 174/35 GC |
| 4,762,966 | 8/1988 | Kosanda | 174/35 GC |
| 4,780,570 | 10/1988 | Chuck | 174/35 GC |
| 5,383,096 | 1/1995 | Benson et al. | 361/816 |
| 5,473,111 | 12/1995 | Hattori et al. | 174/35 R |

*Primary Examiner*—Kristine Kincaid
*Assistant Examiner*—Hung V Ngo
*Attorney, Agent, or Firm*—Laurence R. Letson

[57] ABSTRACT

An improved apparatus for reducing and minimizing Electro-Magnetic Interference (EMI) leakage from electrical devices or assemblies contained in a cabinet or other similar enclosure such as a computer system unit. Spring fingers or arms contained in the enclosure force two adjacent faces of the enclosure components together to create an EMI minimizing seal.

11 Claims, 5 Drawing Sheets

ELECTRONIC CHASSIS ELECTRO-MAGNETIC INTERFERENCE SEAL AND SEALING DEVICE

FIELD OF THE INVENTION

The present invention relates to an improved device and method of preventing Electro-Magnetic Interference (EMI) leakage from electrical devices and more particularly to assemblies where elements of a chassis and lid are forced together for assembly and to form an EMI seal.

BACKGROUND OF THE INVENTION

Since the beginning of the use of electrical devices and assemblies, particularly electronic devices such as computers, there has been the issue of Electro-Magnetic Interference (EMI) which can interfere with sensitive devices and receivers of Radio Frequency (R.F.) signals. EMI can degrade performance of devices that act as R.F. receivers such as computers and other electronic devices. Therefore, there is a need to prevent or minimize EMI leakage from the chassis or housing of the electrical device. As EMI can result in the interference or failure of other electrical devices or assemblies located nearby, the Federal Communications Commission (FCC) has established standards which severely limit the amount of permitted EMI emissions by electronic devices. As a result, there is the need for a means of shielding or eliminating as much of the EMI leakage as possible.

The present invention is an improvement over the previous EMI shielding devices in that a more effective and less expensive seal is created by forcing the planar surfaces of two members into face-to-face and continuous engagement, rather than using an intermittent or gapped seal, as in the prior art. The prior art which implements spring fingers in an attempt to prevent EMI leakage relies on the spring fingers as both a conductive grounding element to interconnect two cover portions electrically and to prevent the leakage. The prior art has not provided or indicated a satisfactory solution for EMI leakage through the gaps created by the spring fingers nor for a continuous and more effective seal without the need for the use of a gasket-like shields, which are fragile and easily damaged or complex shapes to trap the EMI emissions.

Ted Chuck, U.S. Pat. No. 4,789,570 discloses a metal grounding strip with a plurality of grounding spring fingers engaging a portion of a chassis side or lid on the lid edges to establish grounding contact. The grounding strip is partially ineffective to prevent the escape of EMI through the gaps between the chassis and chassis lid, due to the inter-digital gaps.

Unlike the earlier devices, the present invention makes a continuous and more effective seal between the chassis base and the chassis lid without the use of a gasket-like shield, thereby eliminating the gap leakage and minimizing other EMI leakage while avoiding the problems associated with the gasket-like shields and open regions between elements of the chassis assembly.

A better and more complete understanding of the invention may be garnered from the drawings and detailed description of the preferred embodiment of the best mode of the invention as contemplated by the inventors.

OBJECTS OF THE INVENTION

It is an object of the present invention to minimize Electro-Magnetic Interference (EMI) leakage from electronic devices.

It is another object of the present invention to eliminate the need for costly additional parts currently used to create a EMI seal.

It is still another object of the present invention to eliminate the high cost EMI suppression approaches of the prior art, by the use of plastic springs which can be injection molded, to eliminate EMI leakage gaps.

It is a further object of the present invention to provide less expensive yet more effective solution to EMI leakage in electrical devices than are available in the marketplace today.

SUMMARY OF THE INVENTION

A computer housing having two component parts, a chassis base and a chassis lid, is sealed against electromagnetic interference leakage. The lid is slidably engageable in a channel created between a recession in the chassis base and a support rail. The minimization of EMI leakage from the computer housing is desirable and is best accomplished by creating a face-to-face contact between the chassis base and the edges of the lid. This face-to-face contact is the result of spring fingers on the support rail attempting to restore themselves to their original or undeflected position in the channel. The spring fingers may be made of plastic and can be injection molded as it is not necessary for them to function as grounding connections but rather to apply a force on to the chassis lid to create and maintain a face-to-face contact between the chassis base and the lid.

DETAILED DESCRIPTION OF THE PREFERRED EMBODIMENTS OF THE BEST MODE OF CARRYING OUT THE INVENTION

Figure 1:
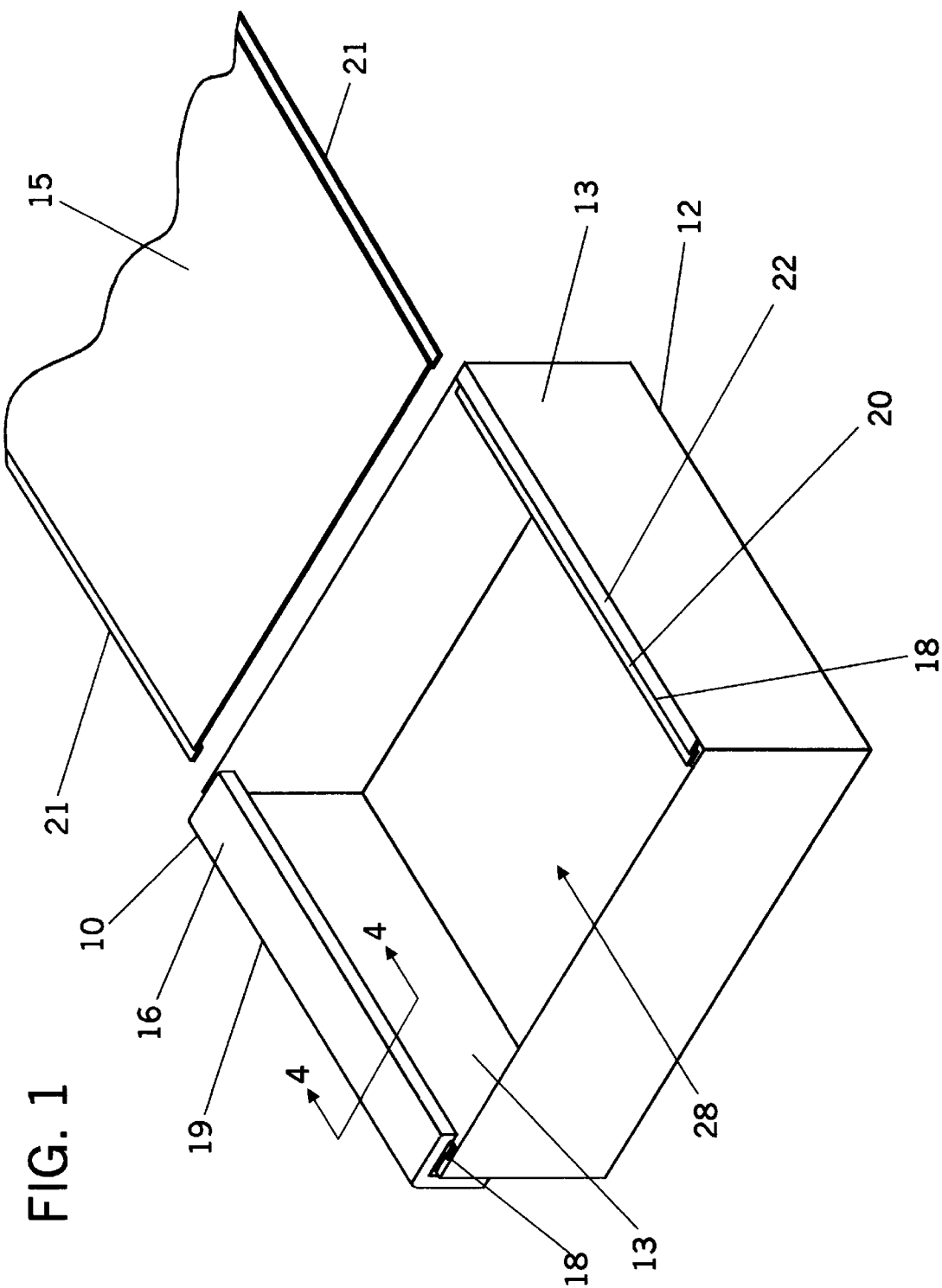
FIG. 1 is a perspective view of a computer housing incorporating the electro-magnetic interference sealing device.

One embodiment of the present invention is illustrated in FIG. 1. The embodiment shown comprises an enclosure 10 fabricated of two sub-assemblies, the chassis base 12 and chassis lid 14.

The chassis base 12 has an open or missing side 28 which may be closed by chassis lid 14. Chassis lid 14 is shown disengaged. Partially extending inward from the walls 13 of the chassis base 12 are support and engagement flanges 18. The preferred shape and design of the support and engagement flanges 18 can best be seen in FIG. 3. It should be noted that surface 22 of flange 18 may be in or close to the same plane as the top edge of chassis base 12, and that surface 20 of flange 18 is slightly recessed from the horizontal plane in which surface 22 lies. This recession can be of a depth dependent on the thickness of the materials used, but should only be as deep as necessary so that when lid 14 is slidably engaged and rests on flanges 18, the top surface 15 of lid 14 is in the same plane as the top surface 19 of support strip 16 or rail 16.

Figure 2:
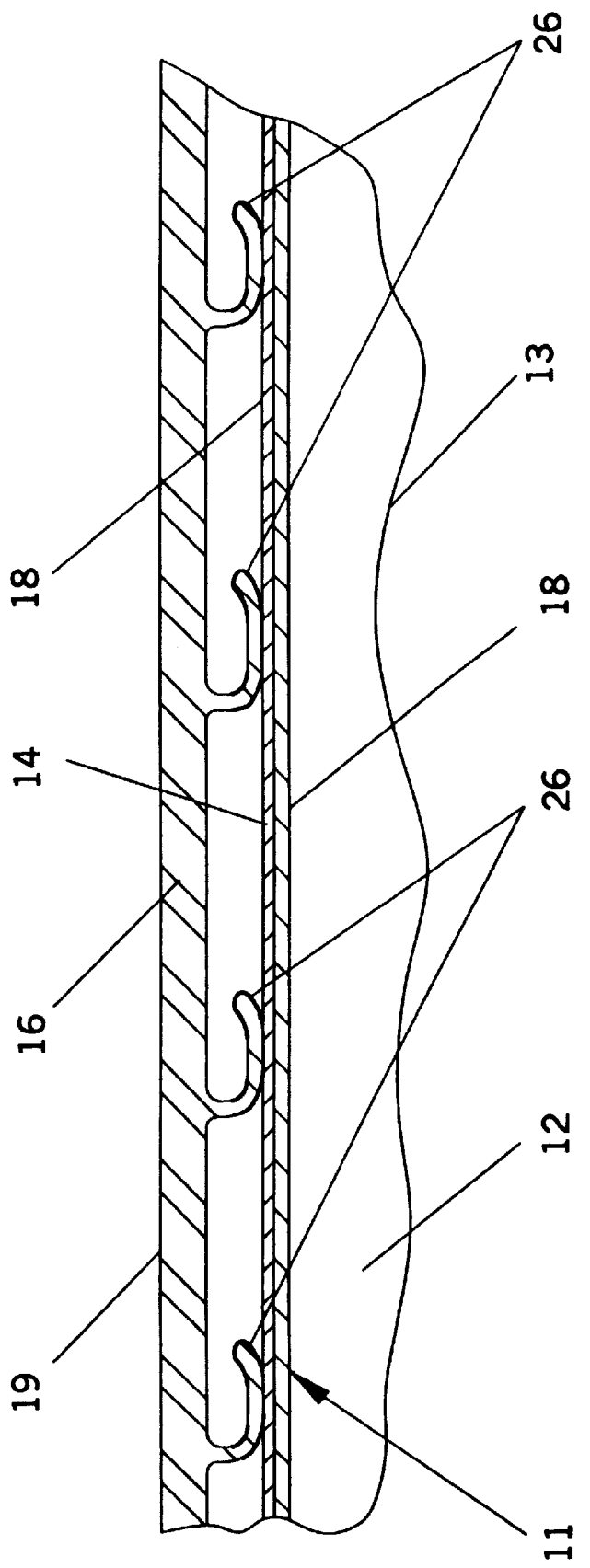
FIG. 2 is an enlarged view of the electro-magnetic interference sealing device engaged with the lid of a computer housing, forming the electro-magnetic interference seal.
Figure 3:
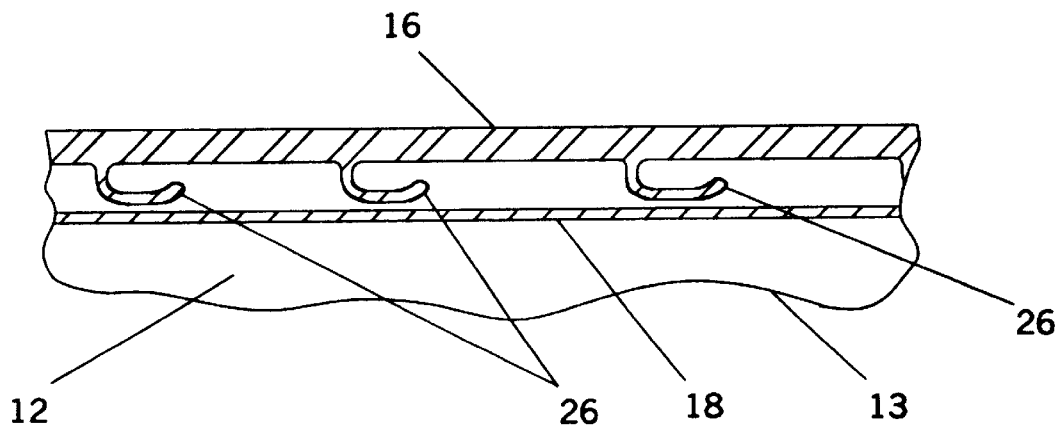
FIG. 3 is an enlarged view of the electro-magnetic interference sealing device disengaged from the lid and with the spring fingers in a relaxed condition.
Figure 4:
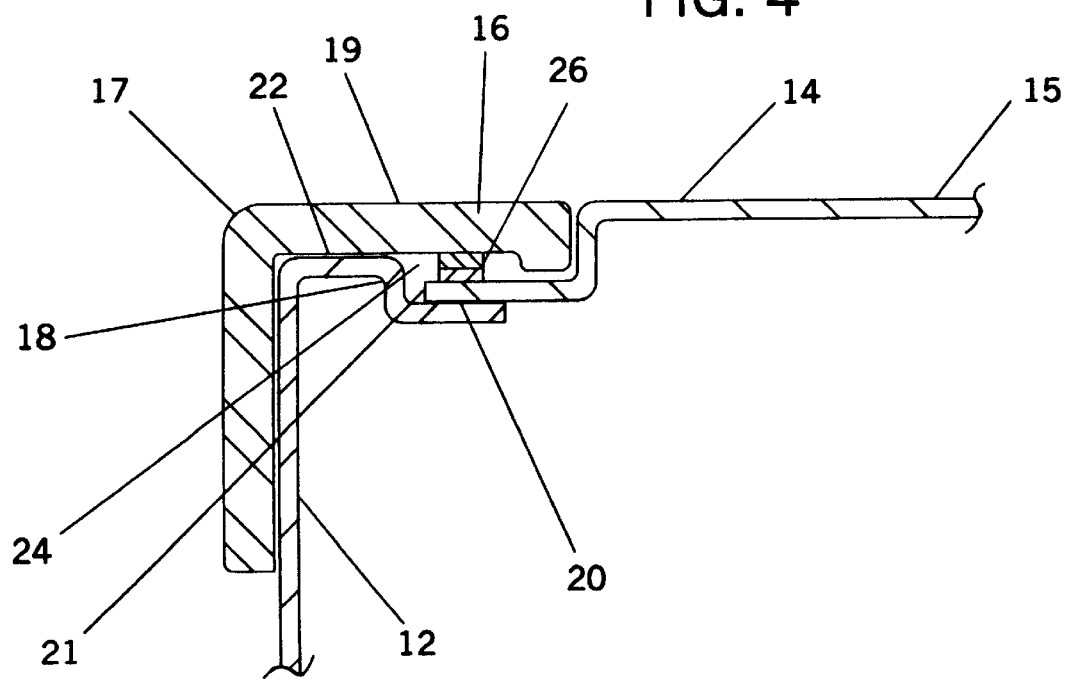
FIG. 4 is an enlarged section-view of the electro-magnetic interference seal viewed at point 4–4, in FIG. 1.

Referring now to FIG. 2, support strip 16 is attached or secured to chassis base 12 in such a manner that support strip 16 extends parallel to flanges 18, thus creating a channel 24 through which chassis lid 14 can slide, as best seen in FIG. 3. Support strip 16 or rail 16 may advantageously be formed as a portion of a decorative plastic rail 17 or bezel 40, or may be separate and attached to the bezel 40 if desired. The support strip 16 may alternatively be attached to a rigid portion of the chassis base 12 by adhesives, rivets, screws or other fasteners in a conventional manner, not shown. Support strip 16 is positioned such that spring fingers 26 or arms 26 are located in channel 24 and extend toward flange 18 of base 12. Further, the spring fingers 26 are disposed so that insertion of chassis lid 14 causes flexing of the spring fingers 26 toward the support strip 16 and does not create a twisting motion.

In the preferred embodiment, lid 14 will have at least two edges 21 which are displaced or recessed from the plane of the remainder of the lid 14. The recessed edges 21 should be disposed in a such a manner that when lid 14 is slidably engaged with base 12 the top surface 15 of lid 14 lies in the same plane as the top surface 19 of support strip 16 or the top surface of the chassis 12 for aesthetic reasons. Should other reasons dictate, the relative placement of the top surface of lid 14 may be placed at any relative location with regard to the top surface of chassis 12 or support strip 16.

As shown in FIGS. 2,3 support strip 16 supports a plurality spring fingers 26. The number of spring fingers 26 may vary depending on the rigidity of the material used in base 12 and lid 14, so long as there is an adequate number of spring fingers 26 to ensure that a substantially continuous contact is created. The spring fingers 26 may be made of plastic or metal, but are plastic in the preferred embodiment. The use of plastic springs fingers 26 significantly reduces cost as it allows injection molding to be used when forming the support strips 16 and eliminates the need to attach spring fingers 26 in a later step. In this invention, the spring fingers 26 need not be metal as they do not act as ground connections, but function only to ensure that contact is made between chassis base 12 and chassis lid 14 by means of compressive forces. However, metal spring fingers could be used for the same purpose.

Spring fingers 26 are shown in FIG. 3 in a relaxed or non-deflected position prior to lid 14 being slidably inserted into channel 24. As lid 14 is slid into channel 24 the spring fingers 26 deflect to allow lid 14 to slide through channel 24 as in FIG. 2. As spring fingers 26 attempt to restore to their original undeflected or relaxed positions they will exert forces onto chassis lid 14 forcing chassis lid 14 onto chassis base 12 creating a face-to-face electrical contact and an EMI seal between base 12 and lid 14 which will minimize EMI leakage from within the chassis. The face-to-face electrical contact effectively grounds the lid 14 to chassis base 12, which in turn is connected to earth ground through the electrical supply network to which the computer is connected, as is conventional for grounding computers through the electrical supply wiring. The electromagnetic radiation generated by electronic circuits and received by the lid 14 and chassis base 12 are converted into small electrical currents in the lid 14 and chassis base 12 and conducted away through the grounding network. Thus the electromagnetic radiation is not broadcast beyond the confines of the chassis base 12 and lid 14 and become EMI. The grounding contact seal between the lid 14 and chassis base 12 prevents escape of the EMI and conducts the current of EMI received by lid 14 to chassis base 12.

Figure 5:
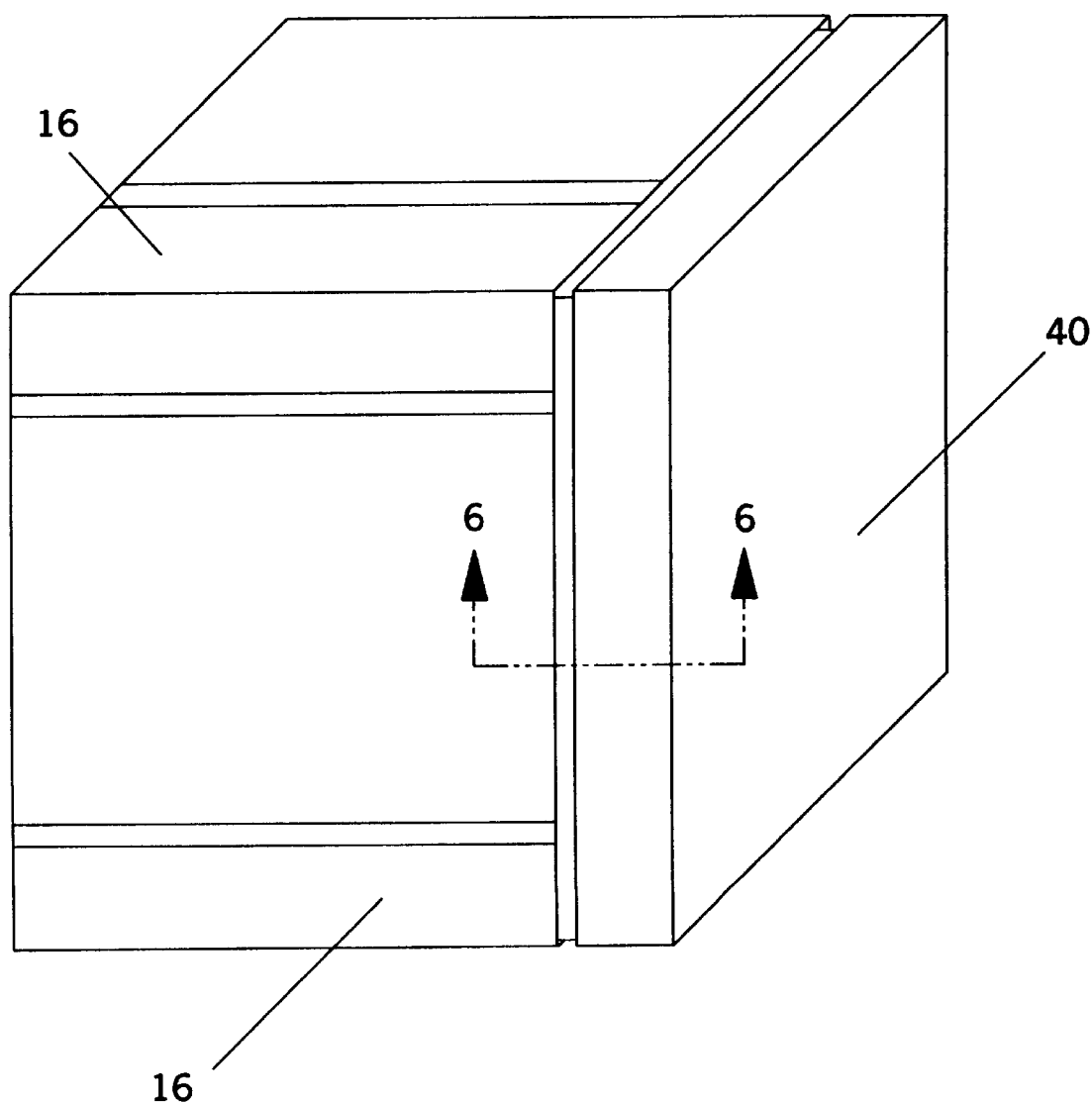
FIG. 5 is a perspective view of an electronic housing having decorative plastic bezel which may advantageously incorporate the invention.
Figure 6:
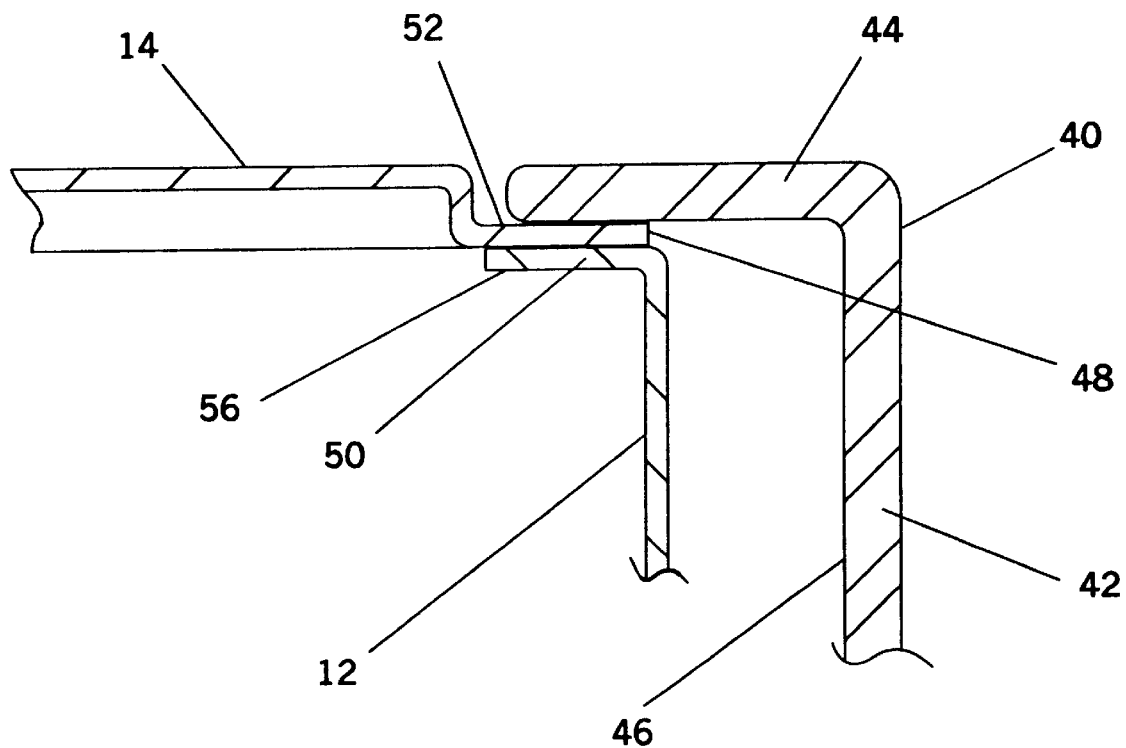
FIG. 6 is section view at 6–6 in FIG. 5 illustrating the structure of a plastic member forcing parts of an electronic enclosure together creating the desired EMI seal.

An alternative embodiment is illustrated in FIGS. 5 and 6. FIG. 5 illustrates a chassis 12 and lid 14 for an electronic component, for example, a computer system unit, containing electronic elements and circuits, not shown. The decorative support rails 16 are of the type illustrated in FIGS. 1 and 2, which accommodates the sliding assembly of lid 14 to chassis 12 as described earlier. The decorative bezel 40 is designed to fit over the end of the chassis base 12/lid 14 assembly. The bezel 40 may also provide openings, not shown, to permit operator access to such items as disk drives, switches and indicator lights, as is conventional.

The structure of bezel 40 is illustrated in section view on FIG. 6. Bezel 40 is comprised of a front panel 42 and flanges 44 attached to or formed with front panel 42. The bezel 40, being molded of plastic, may be formed with flange 44 oriented to slope inward toward the center of the front panel 42 and thus forms an opening to the back side 46 of bezel 40 that is slightly smaller than the end of chassis 12/lid 14 assembly. The installation of the bezel 40 onto the chassis 12 requiring deflection of the flanges 44 will cause an inherent force against the chassis 12. When the lid 14 is slid onto the chassis 12 it is engaged by the support rails 16 and is forcibly engaged with flanges 18. At the completion of the sliding insertion of lid 14, the leading edge 48 of lid 14 will approach and slide over chassis flange 50. The bezel flange 44 will then engage the outer surface 52 of lid 14 and due to the bezel flange 44 being deflected outward to accommodate the chassis 12/lid 14 assembly the natural restorative action of the bezel flange 44 will force lid 14 against the chassis flange 50, creating the desired EMI seal.

A plurality of dimples 56 may be formed into the chassis flange 50 or the lid 14. The dimples 56 formed on both members 12, 14 if desired and aligned to meet if desired. The purpose of the dimples 56 is to concentrate the force exerted on the lid 14 and form a concentrated force contact. The dimples 56 may be placed at regular intervals and create an effective EMI seal and grounding connections.

The foregoing description of preferred embodiments of the invention is for purposes of illustration and description of the preferred embodiments, and is not intended to be exhaustive or to limit the invention to the precise form disclosed. It is also recognized that many variations of the particular apparatus disclosed will occur to one skilled in the art, without departing from the spirit of the invention. It is to be understood that the invention is not limited to the precise embodiment disclosed, and that various changes and modifications may be effected therein without departing from the scope or spirit of the invention. Accordingly, the invention is to be deemed limited only by the scope of the appended claims.

We claim:

1. An enclosure for an electrical device comprising:
   a plurality of walls forming a chassis base;
   said chassis base having an open side;
   a chassis lid;
   said chassis base having engaging and supporting flanges partially extending inward on the open side and capable of supporting said lid;
   at least one support rail mounted on the chassis base;
   said support rail attached to the chassis base to dispose said support rail above one of said engaging and supporting flanges, creating a channel between one of the flanges and said rail;

said support rail having a plurality of spring fingers extending into said channel;

said chassis lid slidably engageable in said channel created between the chassis base and support rail and said lid biased by said fingers to contact said chassis base.

2. The enclosure of claim 1, wherein, the chassis base, lid, and spring fingers are formed of metal.

3. The enclosure of claim 1, wherein, the spring fingers are formed of plastic.

4. The enclosure of claim 1, wherein the spring fingers are integrally formed with said support rail.

5. The enclosure of claim 1 wherein said spring fingers extend from said support rail and engage said lid on a planar surface, urging said lid into face-to-face contact with at least a portion of said chassis base.

6. The enclosure of claim 1 wherein said support rail is attached to and forms a portion of a member associated with said chassis base.

7. The enclosure of claim 6 wherein said support strip is non-conductive.

8. An enclosure for an electrical system comprising:

a conductive chassis;

a conductive lid for closing said chassis;

a zone of engagement between said chassis and said lid;

a biasing member extending along said zone of engagement and deflectable to engage and bias said lid against said chassis in a direction normal to a surface of said lid engageable with said chassis, said biasing member comprises a support strip and a plurality of deformable resilient extensions having a long axis, said long axis oriented in the direction of movement of said lid during the assembly and disassembly of said lid relative to said chassis, whereby deflection of said biasing member resulting from sliding of said lid along said zone of engagement during said assembly stores energy within said biasing member to bias said lid into contact with said chassis.

9. The enclosure of claim 8 wherein said supporting strip is attached to said chassis.

10. The enclosure of claim 9 wherein said supporting strip attaches to said chassis by frictional engagement of said biasing member with said lid.

11. The enclosure of claim 9 wherein said supporting strip and biasing member are non-electrically conductive.

* * * * *